(12) United States Patent
Remla et al.

(10) Patent No.: US 9,083,347 B1
(45) Date of Patent: Jul. 14, 2015

(54) BUILT-IN INTEGRATED CIRCUIT DEBUG DESIGN

(71) Applicant: Xilinx, Inc., San Jose, CA (US)

(72) Inventors: Riyas Noorudeen Remla, Singapore (SG); Rajesh Bansal, Sengkang (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/280,188

(22) Filed: May 16, 2014

(51) Int. Cl.
*H03K 21/38* (2006.01)

(52) U.S. Cl.
CPC ..................................... *H03K 21/38* (2013.01)

(58) Field of Classification Search
CPC .............. G06F 11/3476; G06F 11/348; G06F 11/3495; H03M 9/00
USPC .......................................... 377/67, 75, 77, 80
See application file for complete search history.

(56) References Cited

U.S. PATENT DOCUMENTS

| 7,546,642 | B2 * | 6/2009 | Williams | 726/30 |
| 7,827,433 | B1 * | 11/2010 | Hutton | 713/600 |
| 8,856,406 | B2 * | 10/2014 | Kris et al. | 710/48 |

* cited by examiner

*Primary Examiner* — Jeffrey Zweizig
(74) *Attorney, Agent, or Firm* — Kin-Wah Tong

(57) ABSTRACT

Circuits and methods for capturing internal signal values in a circuit before, during, and after a trigger event are disclosed. For example, a circuit can include a shift register configured to receive data values of an input data set over a plurality of cycles, and a counter unit configured to receive a trigger signal and to output the trigger signal after a number of cycles following the receiving of the trigger signal, where the trigger signal indicates a trigger event. The circuit can also include a switch configured to receive the trigger signal from the counter unit and to open a connection between an input interface and the shift register in response to receiving the trigger signal.

20 Claims, 8 Drawing Sheets

BUILT-IN INTEGRATED CIRCUIT DEBUG DESIGN

TECHNICAL FIELD

The present disclosure relates generally to real-time debugging of integrated circuits, and more particularly to devices and methods to capture internal signal values in the circuit before, during, and after an event trigger.

BACKGROUND

There are several existing techniques relating to silicon debug. For example, one such technique is referred to as clock-stop and scan-dump (CSSD), in which an application (e.g., one that is known to cause failures) is run as if in normal functional mode. At a pre-determined point in time, clocks are stopped, and once the design is known to be quiescent, the flip-flops ("FFs") in the design are configured into one or more shift-registers, called "scan-registers" (usually by asserting a "scan-enable" signal). A scan-clock, which may run at a user-defined frequency, is used next to shift out, or "dump" the contents of the FFs for analysis. In many cases, additional logic and fabric resources may be required. For example, in the case of a field-programmable gate array (FPGA), resources such as an Integrated Logic Analyzer (ILA), Joint Testing Action Group (JTAG) interface, and the like may be required. However, the scan registers capture signal values at a particular point in time, and the technique is only useful for addressing structural faults. Thus, it is generally not possible to control status information of an internal signal after a particular event.

Another technique relating to real-time monitoring of hard block signals, e.g., in a transceiver, involves using a first-in first-out buffer to bring the real-time values of the signals out to the programmable fabric of the device. However, from a hard silicon block point of view, this approach is limited to a few clock domains and also requires more logic and verification effort. For example, large clock multiplexers are generally required in connection with this approach, which add clock insertion delays that can affect the performance of the design. Thus, the debugging of integrated circuits continues to be complex and time consuming.

Therefore, it is desirable to provide circuits and methods that facilitate the debugging of integrated circuits.

SUMMARY

In one example, the present disclosure provides a circuit that can include a shift register configured to receive data values of an input data set over a plurality of cycles, and a counter unit configured to receive a trigger signal and to output the trigger signal after a number of cycles following receipt of the trigger signal, where the trigger signal indicates a trigger event. The circuit can also include a switch configured to receive the trigger signal from the counter unit and to open a connection between an input interface and the shift register in response to receiving the trigger signal.

The present disclosure also provides a circuit that can include a pipeline stage having a plurality of flip-flops for holding data values from an input data set from a number of cycles prior to a trigger signal and a first plurality of registers for storing the data values from the input data set from the number of cycles prior to the trigger signal, where each register of the first plurality of registers receives an output of a respective one of the plurality of flip-flops. The circuit can also include a switch configured to receive the trigger signal and to open connections between the first plurality of registers and the plurality of flip-flops in response to receiving the trigger signal, a counter unit configured to receive the trigger signal and to output a count of a number of cycles after the trigger signal, and a demultiplexer with a select line, controlled by an output of the counter unit, for selecting one of a plurality of output lanes. The circuit can further include a second plurality of registers for storing data values from the input data set at a time of the trigger signal and from the number of cycles after the trigger signal, where each of the second plurality of registers is connected to one of the plurality of output lanes of the demultiplexer.

In another example, the present disclosure provides a method for capturing internal signal values in a circuit before, during, and after a trigger event. For example, the method can include selecting an input data set, selecting a trigger event input, storing data values from the input data set over a plurality of cycles in a shift register, and stopping the storing of the data values from the input data set over a plurality of cycles in the shift register following a number of cycles after a trigger signal.

In still another example, the present disclosure provides a method for capturing internal signal values in a circuit before, during, and after a trigger event. For example, the method can include selecting an input data set, selecting a trigger event input and storing data values from the input data set over a plurality of cycles in a first plurality of registers, where the first plurality of registers are fed by a pipeline stage comprising a plurality of flip-flops. The method can further include opening connections between the plurality of flip-flop and the first plurality of registers in response to receiving a trigger signal via the trigger event input, and storing data values from the input data set at a time of the trigger signal and from a number of cycles after the trigger signal in a second plurality of registers.

BRIEF DESCRIPTION OF THE DRAWINGS

Accompanying drawings show exemplary circuits and methods in accordance with one or more aspects of the disclosure; however, the accompanying drawings should not be taken to limit the disclosure to the examples shown, but are for explanation and understanding only.

DETAILED DESCRIPTION

Figure 1:
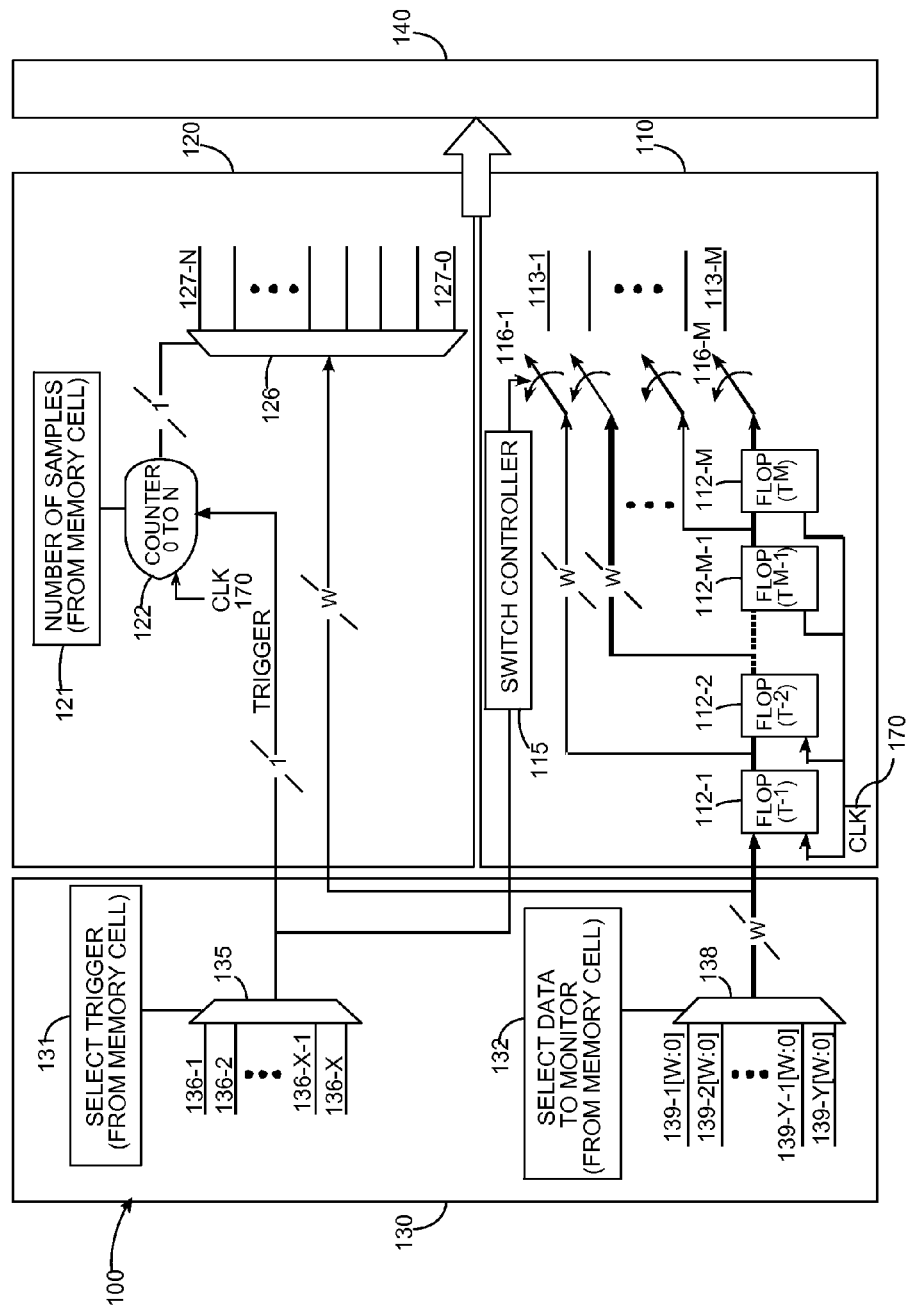
FIG. 1 illustrates a block diagram of a module of a circuit, or device, according to one example of the present disclosure.

Examples of the present disclosure include circuits and modules for capturing internal signal values before, during, and after a trigger event. For instance, in one example a module may include one or more registers configured to receive selected debug data values for internal signals of the circuit for a predetermined number of cycles before and after a trigger event. In one example, a first multiplexer is provided which allows the selection of one of several input data sets and a second multiplexer is provided which allows the selection of one of several possible trigger conditions, or events. In one example, a user can configure the number of cycles, the particular input data set and a particular trigger condition via a memory cell storing the user's selections, which are then provided to the module via one or more external interfaces. As such, the internal signal values of interest, the trigger event(s), and the number of cycles after the trigger event may all be selected as user-defined operating parameters, in accordance with the present disclosure. It should be noted that as used herein, the term "memory cell" may broadly refer to any read and write memory element which can be accessed through a memory interface. Thus, a "memory cell" may comprise a control register flip-flop, a custom memory cell, and so forth. In addition, the term "external interface" may broadly refer to any memory interface such as Dynamic Reconfiguration Port (DRP), Advanced eXtensible Interface (AXI), AXILite or similar interface type.

The exemplary modules and circuits for capturing internal signal values before, during, and after a trigger event, as described herein, can be used to investigate and debug hard and soft blocks which pass in the design stage, but fail in silicon implementation. Examples of the present disclosure are similar to assertions used in simulation-based verification. These assertions are generally used for pin-pointing the location where the error is occurring. Accordingly, the built-in debug solutions of the present disclosure can be viewed as built-in hardware assertions which capture signal values upon the observation of an error on the chip. For instance, examples of the present disclosure can be used for debugging functional bugs (which may have been missed during simulation-based verification), detecting improper configurations, and so forth.

Typically, post-silicon failures are data errors. In some cases, an error in one block may be due to the side effect(s) of some other block or control module. Therefore, it may be difficult to determine the cause of the failure without enough signals to observe. To illustrate, a user may notice performance issues relating to an elastic buffer (a first-in first-out (FIFO) buffer) of a transceiver design. An elastic buffer is involved in transferring data across asynchronous clock domains and also performs over-flow detection, under-flow detection, clock correction, fast training sequence (FTS) de-skew and channel bonding. Detection of overflow/underflow is often, but not always, caused by phase and frequency variation in clock signaling, e.g., where the clock values are outside of the design parameters of the elastic buffer. Accordingly, examples of the present disclosure may be used to observe the read/write address of the elastic buffer before, during, and after a trigger event (e.g., detection of overflow/underflow by the elastic buffer), in order to assist in distinguishing between faulty clock signals or some other root cause. For instance, if the read and write addresses are far apart at the time of assertion, then it is evident that the elastic buffer is not close to overflow or underflow, but instead, the detection is caused by some glitch.

Elastic buffer overflow and underflow detection is typically generated by comparing read and write pointers, converting to gray code and synchronizing from one clock domain to another. In this way, the intermediate state of the multi-bit counter is minimized. An output of the comparison logic is connected to a 'set' pin of a latch to create a sticky overflow/underflow condition. However, a failure to convert to gray code before synchronizing to the other clock domain may cause a glitch and set a false underflow/overflow condition, even though the pointers are far apart. Using the exemplary modules and circuits of the present disclosure, the pointers can be read out for several cycles before and after the overflow/underflow assertion to verify the reported status is correct. This information is useful to narrow down the possible root causes and to continue with further aspects of a silicon debug process.

As another example, it may be apparent that performance of an elastic buffer is affected by clock issues. A typical response is to provide clock correction signals to the elastic buffer. However, if the elastic buffer continues to operate in its "danger zone" even after sending clock correction signals, it would be useful to observe FIFO pointer adjustments based on the clock correction. Thus, in accordance with examples of the present disclosure, a user may group the desired signals (FIFO pointer adjustments) as a set of input data values, select a trigger event (e.g., the sending of the clock correction signals) and select a desired number of cycles before and after the trigger event over which to capture the input data values. In still another example, at the end of FTS de-skew or channel bonding, if the channel fails to de-skew, it may be useful to probe FTS related signals and/or channel bonding related signals. Accordingly, a user may group the desired signals (FTS related signals and/or channel bonding signals) as a set of input data values, select a trigger event (e.g., the end of FTS de-skew or channel bonding) and select a desired number of cycles before and after the trigger event over which to capture the input data values.

Although several examples are described above in connection with debugging an elastic buffer of a transceiver, it should be understood that the exemplary modules and circuits of the present disclosure are useful in a broad range of applications which are not limited to these illustrative cases. Thus, examples of the present disclosure may be broadly applied to, and implemented in hard blocks and soft blocks of various types of integrated circuits.

To aid in understanding the present disclosure, an exemplary device, or module of a circuit, 100 is depicted in FIG. 1. In particular, module 100 may comprise a portion of an integrated circuit that is designed to capture internal signal values, or debug data values in the circuit before, during, and after a trigger. In this regard, although module 100 may comprise only a portion of a larger circuit, the module 100 may itself be referred to herein as a "circuit". Module 100 includes a first sub-module 110 for capturing data values before a trigger event and a second sub-module 120 for capturing data values after a trigger event. A third sub-module 130 is for selecting a trigger event and for selecting an input data set to monitor. An external interface 140 allows the module 100 to be connected to and accessed by external devices or other portions of the circuit. For example, external interface 140 may comprise a DRP, AXI, AXILite or similar interface type, and allows access to the module 100 to provide a trigger select input 131, a data select input 132 and input 121 to select a number of cycles following the trigger event for which data values from the selected input data set are to be recorded.

To further illustrate, the trigger select input 131 controls a select line of multiplexer 135 which causes the multiplexer 135 to select a corresponding trigger event input from a plurality of trigger event inputs 136-1 to 136-X, where "X" is a number corresponding to the total number of inputs to the multiplexer 135. In one example, each of the trigger event inputs 136-1 to 136-X is fed by a corresponding trigger event logic. For instance, control logic for each of the trigger event inputs 136-1 to 136-X may reside in a portion of module 100, or in a portion of a circuit containing module 100, and may include a direct connection between the control logic and the multiplexer 135.

As an example, if the trigger select input 131 selects input "2", then the trigger event input 136-2 will pass to the output of the multiplexer 135. Accordingly, if and when the trigger event occurs, a trigger signal may be sent by the trigger event logic to trigger event input 136-2, which is passed through to the output of the multiplexer 135. In one example, the trigger event input is kept quiescent, e.g., at a logic '0' value. Only when a trigger event is detected does the trigger event input send a trigger signal of logic '1' to indicate that the trigger event has occurred.

It should be noted that while various examples herein describe a trigger as a one-cycle wide pulse, the present disclosure is not limited to this particular implementation. Thus, a trigger may take various other forms in accordance with the present disclosure, such as a level trigger, an even trigger and so forth. In one example, external logic is used on other signals to generate a one-cycle pulse trigger (or other trigger type). For instance, it may be desired to have a trigger for signaling an address change from hexadecimal address 'FFFE' to 'FFFF'. In this case, detecting logic may be deployed for generating a single pulse from this transition. For example, a rising edge detector circuit having a comparator may be used to generate a single-cycle pulse (or other trigger type) upon the address change.

In another example, control logic for any one or more of the trigger event inputs 136-1 to 136-X may reside in another location, such as in a dedicated external circuit, e.g., in a configurable memory cell which is external to the module 100, and so forth. In one example, connections between the control logic and multiplexer 135 may be provided via the external interface 140. For example, a user may desire to capture internal signal values of the circuit based on a real-time trigger given externally. To enable this functionality, in one example a memory cell (preselected address location) may be written through the external interface 140 and/or through a JTAG interface, fabric pins, or through an external processor. Upon a transition of the memory cell trigger (e.g., '0' to '1'), the module 120 may then commence with capturing of data values of a selected input data set. This approach is useful, for example, in serializer/deserializer (SerDes) debugging where it may be desired to monitor decision feedback equalization (DFE) adaptation loop values. For instance, once the circuit is running, monitoring via module 100 may be triggered through one of the external trigger methods to capture the DFE loop values, which can later be read out and analyzed.

Data select input 132 controls a select line of multiplexer 138 which causes the multiplexer 138 to select a corresponding input data set from a plurality of inputs data sets 139-1 to 139-Y, where 'Y' is a number corresponding to the total number of inputs to the multiplexer 138. Each of the inputs data sets 139-1 to 139-Y comprises a set of internal signal values of interest. For example, input data set 139-1 may comprise a set of 1 to 'W' selected data values, whereas input data set 139-2 may comprise a different set of anywhere from 1 to 'W' selected data values. For example, if the module 100 is designed for at most 16-bit wide inputs, then 'W' may equal 16. In other words, each input data set 139-1 to 139-Y may comprise a W-bit wide lane. However, there is no requirement that all 'W' bits be utilized. In one example, corresponding logic for providing the desired signals for each of the input data sets 139-1 to 139-Y may reside in a portion of module 100, or in a portion of a circuit containing module 100, and may include a direct connection to the multiplexer 138.

The output of multiplexer 138 comprises 'W' parallel lanes, and is split into two branches—one to feed a flip-flop pipeline in the first sub-module 110 and another to feed a demultiplexer 126 in the second sub-module 120. The output of multiplexer 135 is also split into two branches—a first for conveying a trigger signal to a switch controller 115 in sub-module 110 and a second for conveying the trigger signal to counter unit 122 in sub-module 120. The pipeline of flip-flops (FFs) 112-1 to 112-M, is for storing data values of the selected input data set for 'M' clock cycles before the trigger event. For instance, FF 112-1 holds a data value from a cycle immediately preceding a trigger event, FF 112-2 holds a data value from a time two clock cycles prior to the trigger event, FF 112-M holds a data value from 'M' clock cycles prior to the trigger event, and so forth. An output of each of the FFs 112-1 to 112-M is fed into a respective register 113-1 to 113-M. As such, register 113-1 holds a data value from a clock cycle immediately preceding the present time, register 113-2 holds a data value from a time two clock cycles prior to the present time, register 113-M holds a data value from 'M' clock cycles prior to the present time, and so forth.

Each of the FFs 112-1 to 112-M is also configured to receive a clock signal 170 and with each clock cycle, to obtain a new data value (from multiplexer 138 or from a preceding FF in the pipeline) and to output a previously held data value. Thus, the data values in each of registers 113-1 to 113-M are continuously changing as the contents of FFs 112-1 to 112-M are changing with each clock cycle. However, when the switch controller 115 receives the trigger signal from the output of multiplexer 135, it causes the switch controller 115 to open the plurality of "switches" 116-1 to 116-M. As such, the registers 113-1 to 113-M do not continue to receive new data values from the FFs 112-1 to 112-M. In other words, the contents of registers 113-1 to 113-M are now static. It should be noted that in various examples, the switches 116-1 to 116-M, as well as the switch controller 115, may be virtualized, i.e., implemented in digital logic. For example, any one or more of the switches 116-1 to 116-M may be implemented as a pair of gates or other integrated circuit design. In addition, insofar as these concepts are virtualized, in one example the switch controller 115 and switches 116-1 to 116-M are illustrated for symbolic representation only and do not constitute distinct components of the sub-module 110 as depicted in FIG. 1.

As mentioned, the output of multiplexer 135 also conveys the trigger signal to counter unit 122. Upon receiving the trigger signal, counter unit 122 beings to count from '0' to 'N', based upon the cycle of the clock signal 170. The output of counter unit 122 comprises an input of the select line of the demultiplexer 126. Accordingly, at each cycle, demultiplexer 126 directs an input (from the output of multiplexer 138) to a first register 127-0, a second register 127-1, and so forth, up to the Nth cycle which directs the input to the last register, register 127-N. It should be noted that in the example of FIG. 1, the number 'N' implemented by the counter unit 122 is the same as the number 'N' for the number of registers 127-0 to 127-N. However, in another example, a user may select a lesser number of cycles to count after a trigger event for which to capture the selected data, up to the physical maximum number of registers available, 'N'.

Following the above described process, it should be noted that registers 113-1 to 113-M of sub-module 110 contain debug data values of the selected input data set from a selected number of cycles prior to a selected trigger event and that registers 127-0 to 127-N contain data values from the selected input data set from the time of the selected trigger event and for a selected number of cycles, 'N', after the trigger event. Accordingly, these register values may be read out though the external interface 140 using any necessary hand-shake mechanisms to copy the data safely to the external interface. In one example, the read-out data values may further be provided to a waveform viewer, such as the CHIPSCOPE logic analyzer, for data visualization. For instance, the external interface 140, a JTAG interface and/or a processor interface may connect module 100 with the waveform viewer, e.g., on a personal computer, to provide the data values captured by module 100.

It should also be noted that certain portions of module 100 are simplified and that various portions of the module 100 are omitted for clarity. For example, as mentioned above, the input to multiplexer 138 for each input data set 139-1 to 139-Y may comprise a W-bit wide lane. The output of multiplexer 138 may also comprise a W-bit wide lane. In this case, the pipeline comprising the set of FFs 112-1 to 112-M may comprise just one of 'W' total sets of FFs and the switches 116-1 to 116-M may comprise just one set of 'W' total sets of switches. Likewise, registers 113-1 to 113-M and registers 127-0 to 127-N may each respectively comprise a W-bit wide register. In another example, multiplexer 138 may instead comprise one of 'W' total multiplexers. Similarly, demultiplexer 126 may be implemented as one of 'W' total demultiplexers. In one example, 'W' may be a factor of the size, or width of the external interface 140. For example, if the module 100 is incorporated into a 16 or 32-bit circuit, then module 100 may be physically implemented with W=16 or 32 respectively. However, in another example, if a user desires to capture debug data values for an input data set that is more than 'W' bits, the input data set may be split into memory blocks comprising W-bits or less, with each memory block being forwarded sequentially to multiplexer 138. For example, the input data set may comprise 32-bits while module 100 may comprise a 16-bit design. In this case, a pipeline for converting the 32-bit data to 16-bit data may be implemented prior to the input to multiplexer 138. In addition, the maximum number of clock cycles over which the input data is captured may be limited by a factor of the number of memory blocks into which the input data set is segregated.

Figure 2:
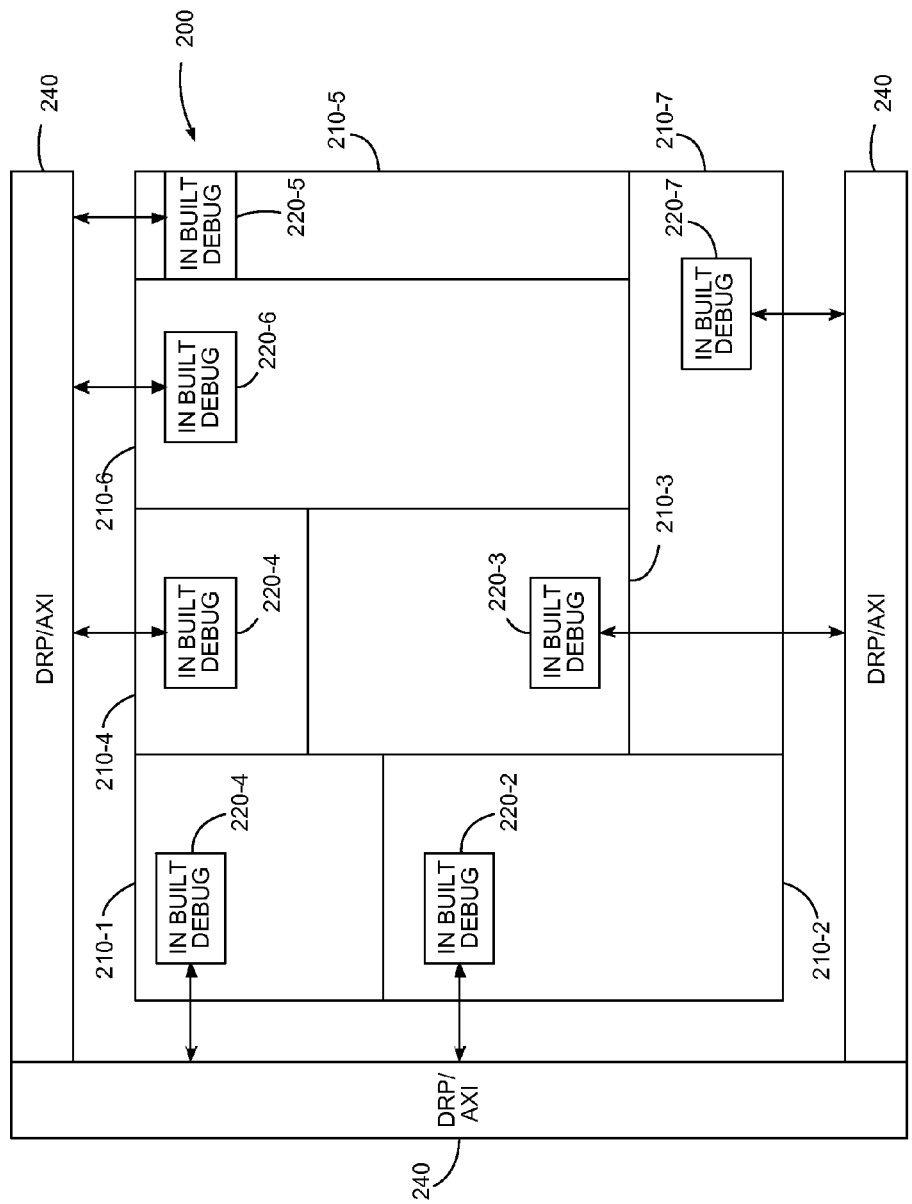
FIG. 2 illustrates a block diagram of an additional circuit, according to one example of the present disclosure.

To further aid in understanding the present disclosure, FIG. 2 illustrates a circuit 200 having a plurality of functional blocks 210-1 to 210-7. Notably, each of the functional blocks 210-1 to 210-7 may comprise a different clock domain, each with its own built-in debug module 220-1 to 220-7. In addition, each of the built-in debug modules 220-1 to 220-7 may comprise a separate module in the same or substantially similar form as module 100 illustrated in FIG. 1. The number of built-in debug modules included in the circuit 200 may be based upon a tradeoff between silicon area and observability. For instance, a designer may determine that not every functional block needs a built-in debug module. In any case, each of the built-in debug modules 220-1 to 220-7 may be configured to operate off of different trigger events or the same trigger event. In other words, the debug data values, selection of trigger events and number of cycles are generic in nature and can be configured though memory cells via the external interface(s) 240.

In general, built-in debug module 220-1 to 220-7 will operate on different triggers, since each has its own control module and trigger inputs, and since each block 210-1 to 210-7 may comprise a different clock domain. However, in the situation where one or more of the built-in debug modules 220-1 to 220-7 are configured to operate off of the same trigger, synchronization may be required across the functional blocks since each is operating in a different clock domain. In any case, each of the built-in debug modules 220-1 to 220-7 may capture data before and after one or more trigger events for a predetermined number of clock cycles, after which the data values in the respective registers are static. Thereafter, the data values in the different registers of each of the different built-in debug modules 220-1 to 220-7 may be scanned out using external interface 240, e.g., DRP, AXI, AXI Lite, or other memory-mapped interface.

Figure 3:
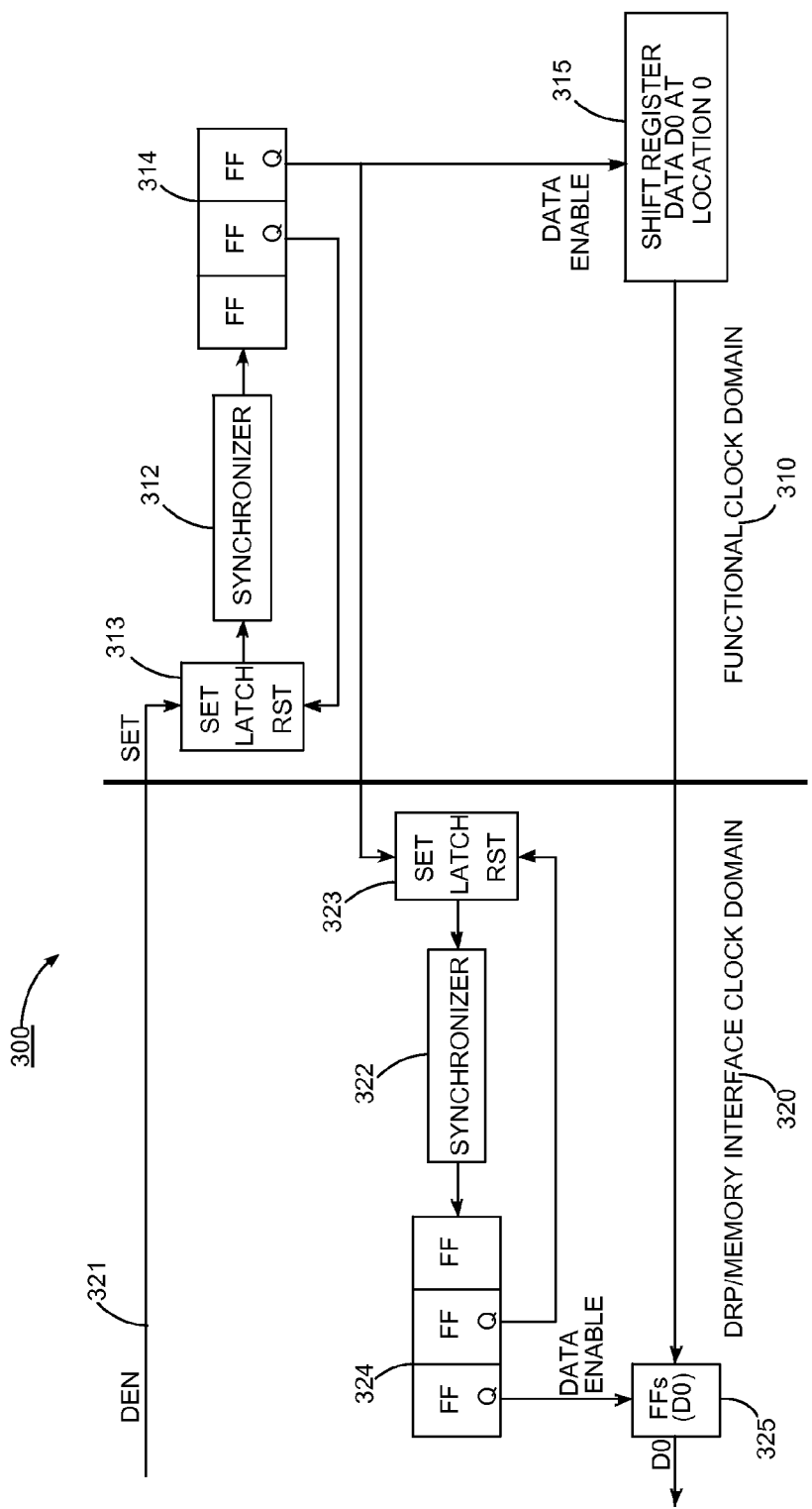
FIG. 3 illustrates a block diagram of a circuit for safely transferring data across clock domains using a handshake mechanism.

Multiple clock cycles are required to copy the data values from registers in each of the built-in debug modules 220-1 to 220-7 to the external interface(s) 240. Thus, in one example the present disclosure provides a handshake process for safely copying debug/register data across clock domains to an external interface. In particular, FIG. 3 illustrates a portion of a circuit 300 that includes a boundary between a functional clock domain 310 and an external interface clock domain 320, e.g., a DRP clock domain. For example, functional clock domain 310 may comprise a soft or hard block of circuit 300 that includes functional logic as well as a built-in debug module. The DEN (DRP Enable) signal 321 from the external interface clock domain 320 is synchronized to the clock of functional clock domain 310 via latch 313, synchronizer 312 and a series of flip-flops (FFs) 314, and it is used to copy the respective shift register location 315 (e.g., data 'D0' at location '0'). After copying the data it has six clock cycles to settle data via latch 323, synchronizer 322 and the series of FFs 324, since the data at shift register location 315 is functionally static. In this way, data will be stable on the receive register 325 of external interface clock domain 320.

Figure 4:
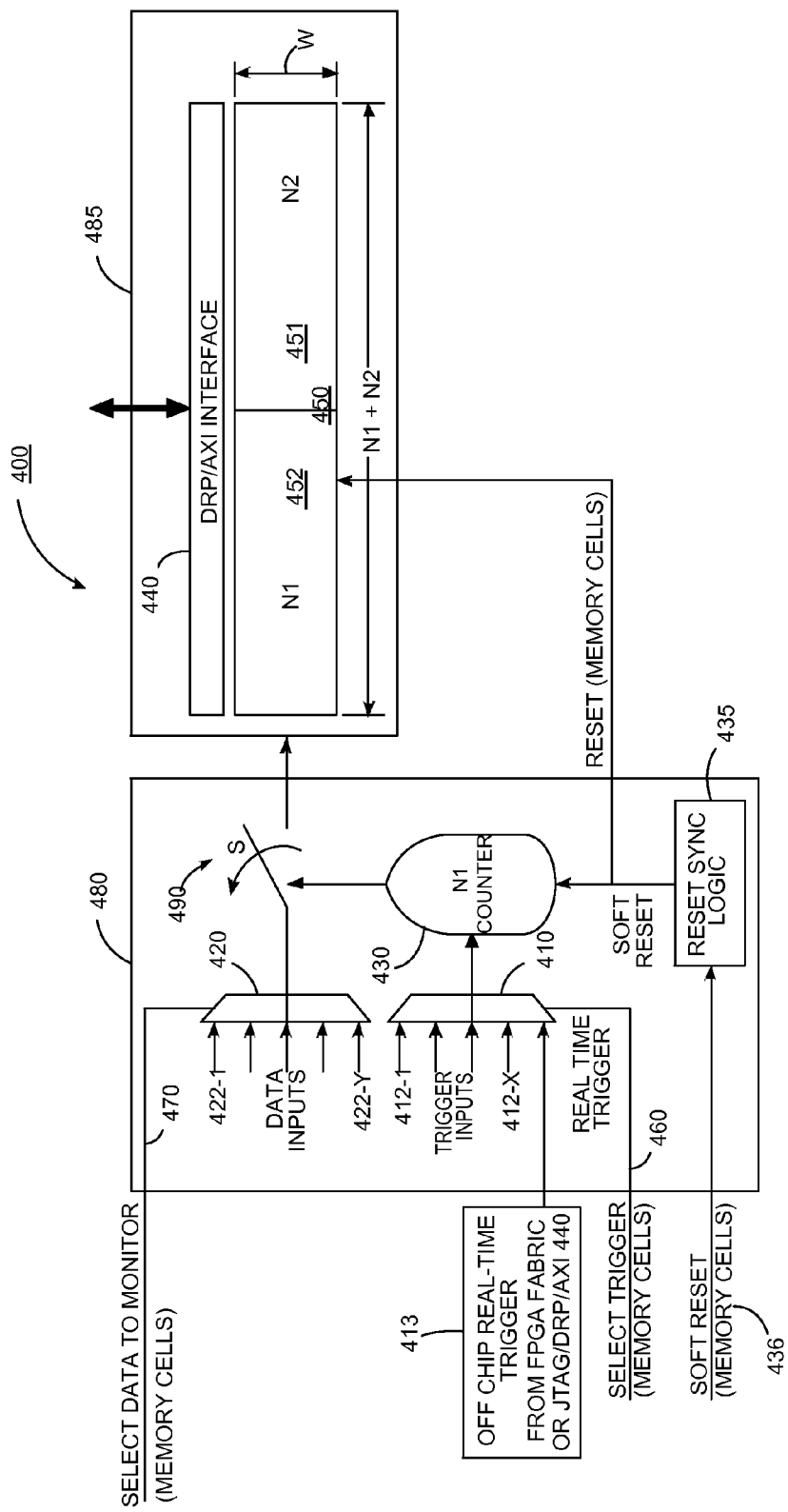
FIG. 4 illustrates a block diagram of still another module, or circuit, according to one example of the present disclosure.

FIG. 4 illustrates an additional example of a device or module of a circuit 400 for capturing internal signal values in the circuit before, during, and after a trigger. In one example, module 400 includes a control portion 480 and a data capture portion 485. In one example, data capture portion 485 includes a shift register 450 having a first half 451 for capturing internal signal values, or debug data values, before a trigger event and second half 452 for capturing signal values during, and after a trigger event. In one example, control portion 480 includes a first multiplexer 410 for selecting one of a plurality of trigger event inputs 412-1 to 412-X under the control of a trigger select input 460. Trigger select input 460 may be controlled by a user, an external or embedded hard or soft processor, and so forth, and may be provided to module 400 from a memory cell via an external interface 440, e.g., a DRP interface, an AXI interface, an AXI Lite interface, or similar interface. The trigger event inputs 412-1 to 412-X may be the same or substantially similar to the trigger event inputs 136-1 to 136-X of FIG. 1. For instance, control logic for any one or more of the trigger event inputs 412-1 to 412-X may reside in a portion of module 400 or in a portion of a circuit containing module 400. Alternatively, or in addition, control logic for any one or more of the trigger event inputs 412-1 to 412-X may reside in a dedicated external circuit 413, e.g., in a configurable memory cell which is external to module 400 and which may connect to the multiplexer 410 via an external interface 440, and so forth. For example, any one of the external trigger methods described above in connection with trigger event inputs 136-1 to 136-X of FIG. 1 may be similarly implemented with respect to control logic for any one or more of trigger event inputs 412-1 to 412-X.

As illustrated in FIG. 4, control portion 480 also includes multiplexer 420 for selecting one of a plurality of input data sets 422-1 to 422-Y under the control of data select input 470, which may be controlled by a user, a processor, and so forth, and may be provided to module 400 via an external memory cell. Corresponding logic for providing the desired signals for each of the input data sets 422-1 to 422-Y may reside in a portion of module 400 or in a portion of a circuit containing module 400. In one example, each of the input data sets 422-1 to 422-Y, as well as the output of multiplexer 420, may comprise a W-bit wide lane. In one example, the maximum width, 'W', may be the same as the bus width of external interface 440.

It should be noted that shift register 450 also has a width, 'W', which may be the same as the width of the external interface 440. Shift register 450 also has a depth of 'N', where N1 is a number of cycles after a trigger event for which data can can be captured in the first half 451 of shift register 450 and N2=N−N1 is a number of cycles before a trigger event for which data can be captured in the second half 452 of shift register 450. Notably, a user may select various values for N1 and N2 so long as the maximum number of cycles captured, N1+N2, does not exceed the depth, 'N' of the shift register 450.

Switch 490 is primarily in a closed state, allowing the input data set selected from among 422-1 to 422-Y to pass through to the output of multiplexer 420, through switch 490 and into the shift register 450. Thus, the shift register 450 receives data values from the selected input data set on a continuous basis. Each clock cycle, the shift register 450 receives a new set of W-bits from the output of multiplexer 420 at one end, and the oldest set of W-bits is flushed from the shift register 450 at the other end.

The output of multiplexer 410 is connected to an input of counter unit 430. Thus, when a trigger signal occurs on the one of the trigger event inputs 412-1 to 412-X that is selected, the trigger signal passes to the output of multiplexer 410 and to counter unit 430. After the trigger signal is received, and at each subsequent clock cycle, counter unit 430 counts from zero to the number of cycles, N1. In one example, a memory cell external to module 400 may store a user and/or processor's selection of N1 and provide this value to module 400 via external interface 440. When the counter unit 430 reaches the selected number of cycles, N1, it outputs a stop signal to switch 490, which causes switch 490 to open. Accordingly, shift register 450 no longer receives new input data values from multiplexer 420 and the contents of shift register 450 effectively remain static. Thereafter, the data values stored in shift register 450 may be read out, e.g., via external interface 440 or using another mechanism. In one example, the read-out data values may further be provided to a waveform viewer, such as the CHIPSCOPE logic analyzer, for data visualization. For instance, the external interface 440, a JTAG interface and/or a processor interface may connect module 400 with the waveform viewer, e.g., on a personal computer, to provide the data values captured by module 400.

After reading out the data values in register 450, the module 400 can be reset for another run. In one embodiment, module 400 may be reset using a "hard reset". For instance, a power-on reset may be applied to module 400 along with all other blocks in the circuit. However, in another embodiment module 400 may be reset using a "soft reset". For instance, a reset signal 436 via a memory cell may drive reset synchronization logic 435, which in turn resets counter unit 430 and shift register 450. As such, subsequent runs may be implemented without having to power-down and power-on the entire circuit. It should be noted that similar hard reset and soft reset mechanisms may be implemented in module 100 of FIG. 1.

Figure 5:
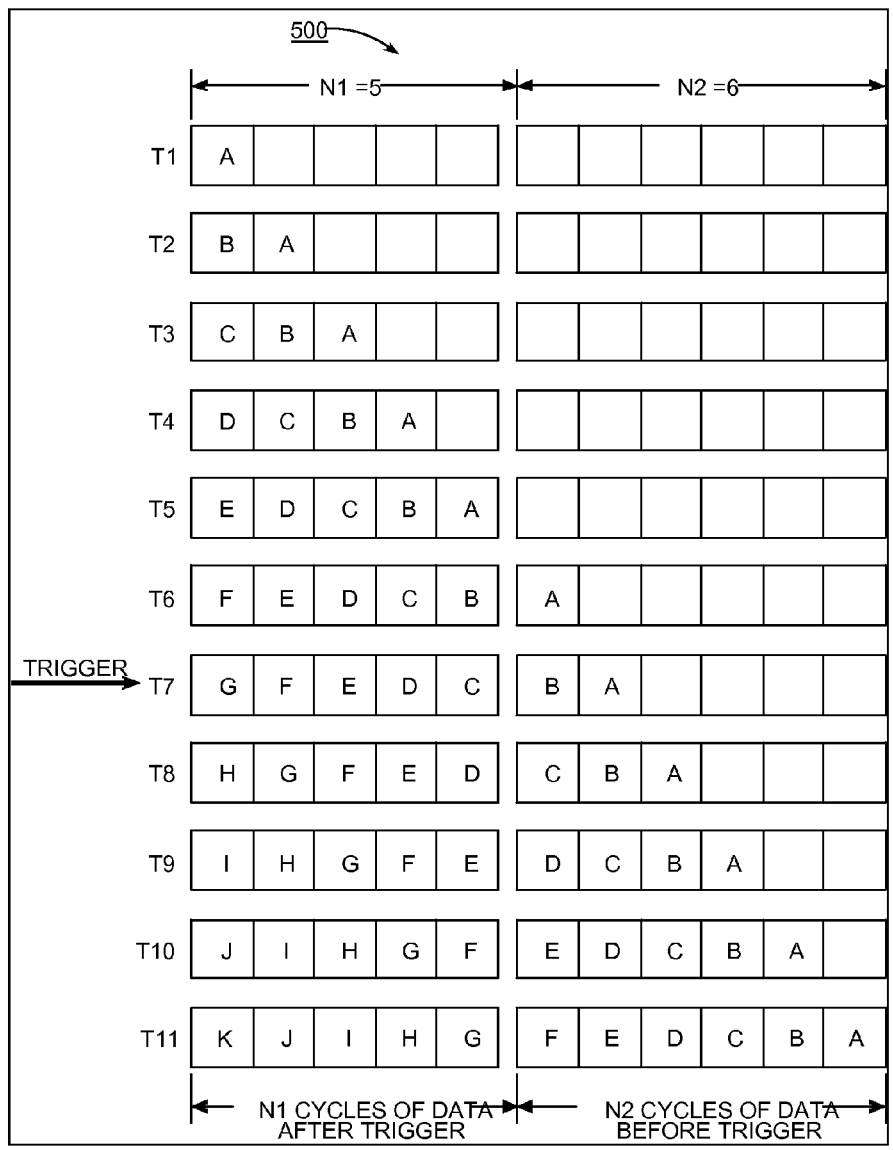
FIG. 5 illustrates a timing diagram for capturing internal signal values in a circuit before, during, and after a trigger event using a shift register, according to one example of the present disclosure.

FIG. 5 illustrates an example timing diagram 500 for capturing internal signal values in a circuit before, during, and after a trigger event using module 400/shift register 450. As illustrated in FIG. 5, the depth of the shift register 450 is 11 and N1, the number of cycles to capture input data values after the trigger event, is set to 5. Therefore, N2, the number of cycles to capture input data values before the trigger event, is 6. The data values in the shift register 450 are indicated at each time T1 to T11 using letters A-K respectively. The trigger signal/trigger event is represented by an arrow which occurs at time T7.

It should be noted that the examples of FIGS. 1 and 4 are provided by way of illustration only, and that other, further, and different examples may be readily implemented in accordance with the present disclosure. For example, module 100 may be modified to omit the multiplexers 135 and 138, or module 400 may omit multiplexers 410 and 420. In addition, logic for selecting one of a plurality of input data sets and for selecting a trigger input may be relegated to other portions of a circuit external to modules 100 or 400, or may reside on a different chip entirely. In addition, the select logic may be implemented using multiplexers or using an entirely different arrangement. In still another example, logic for selecting a particular input data set from a plurality of input data sets and/or for selecting a particular trigger event input from a plurality of trigger event inputs may be omitted entirely. In this regard, the multiplexer 138, and any other alternative arrangement for providing internal signal values of an input data set to sub-modules 110 and 120 of FIG. 1, may broadly be referred to as an "input interface". Similarly, the multiplexer 420 in FIG. 4, and any other manner of connection between an input data set and shift register 450, may also be referred to as an "input interface". In still another example, the user-configurability of the number of cycles before and after a trigger event may also be omitted. Thus, devices and modules incorporating these and other variations are contemplated within the scope of the present disclosure.

Figure 6:
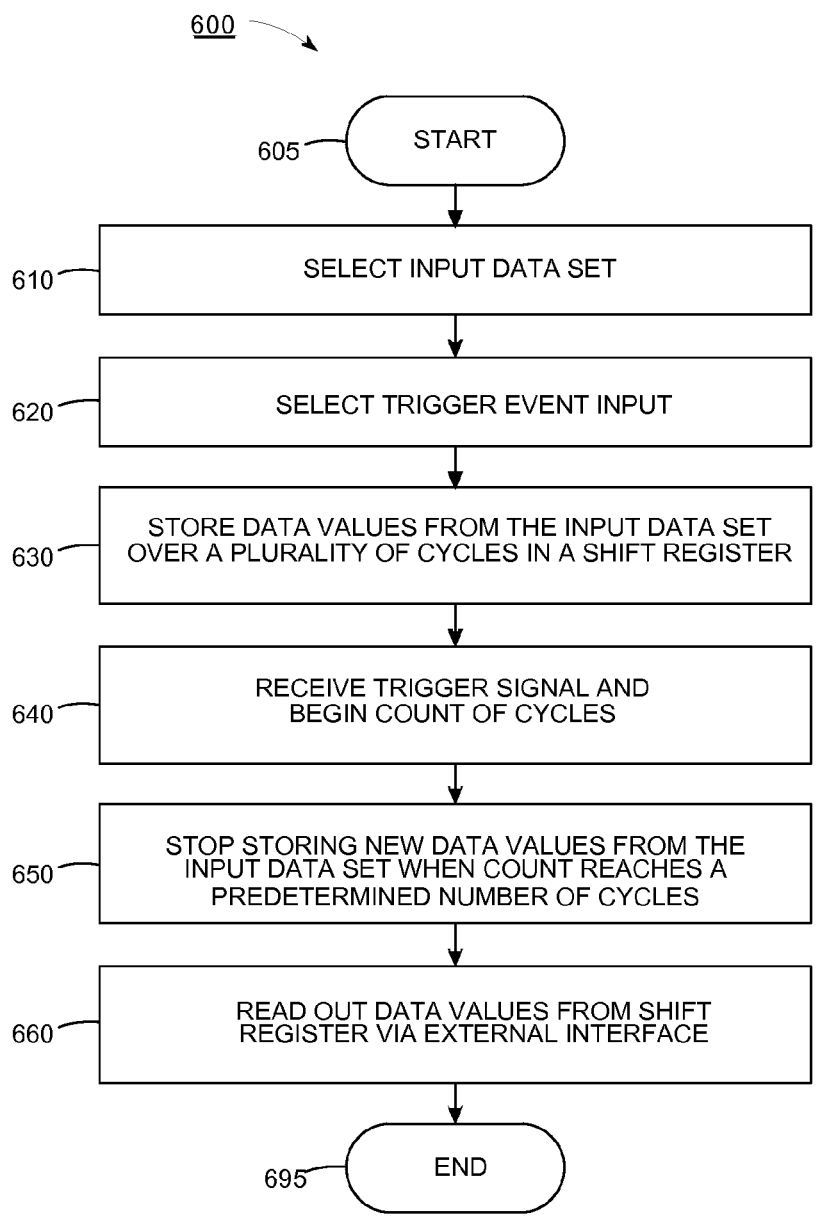
FIG. 6 illustrates a flow diagram of a method for capturing internal signal values in a circuit before, during, and after a trigger event, according to one example of the present disclosure.
Figure 8:
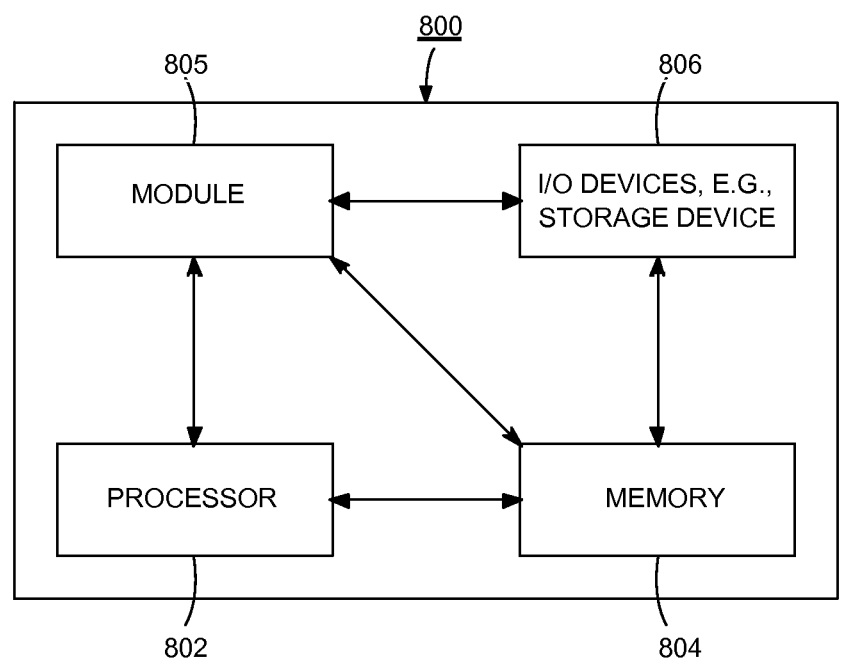
FIG. 8 illustrates a high level block diagram of a general purpose computer, or a computing device suitable for use in performing the functions described herein.

To further aid in understanding the present disclosure, FIG. 6 illustrates a flow diagram of an exemplary method 600 for capturing internal signal values in a circuit before, during, and after a trigger event. For example, any one or more of the steps, operations or functions of the method 600 may be implemented by a module or circuit as described above in connection with FIG. 4. One or more aspects of method 600 may also be implemented by a general purpose computer having one or more processors, a memory, etc. as illustrated in FIG. 8 and described below, specifically programmed to perform the steps, functions and/or operations of the method 600, or to provide input data to configure one or more other devices to implement the operations of the method 600. For illustrative purposes, the method 600 is described below as being performed by a module and/or by a module in conjunction with other elements of a circuit. The method 600 starts in step 605 and proceeds to step 610.

In step 610, the module selects an input data set. For example, a plurality of input data sets may be input to the module, from which the module may select one of the sets. In one example, the module selects a particular input data set based upon a selection by a user. For instance, a user's selection may be stored in a configurable memory cell and provided to the module as an input operating parameter. In one example, the plurality of input data sets comprise a plurality of inputs to a multiplexer, where the module uses a select line of the multiplexer to select the one input data set from the plurality of available input data sets.

At step 620, the module selects a trigger event input. For example, a plurality of trigger event inputs may be input to the module from which the module may select one of the trigger event inputs based upon a selection by a user. For instance, a user's selection may be stored in a configurable memory cell and provided to the module as an input operating parameter. In one example, the plurality of trigger event inputs comprise a plurality of inputs to a multiplexer, where the module uses a select line of the multiplexer to select the one trigger event input from the plurality of available trigger event inputs.

At step 630, the module stores data values from the input data set over a plurality of cycles in a shift register. For example, for each clock cycle, the module may shift-in new data values from the input data set into the shift register. With each cycle, existing data values stored in the shift register may be shifted by one unit or cell. Thus, on an ongoing basis, and for each clock cycle, data value(s) in a last cell may be flushed from the shift register, while new data values may be stored in a first cell. In one example, the shift register, and each cell within the shift register, may have a width of W-bits, where 'W' is a same number of bits as a maximum width of the plurality of input data sets.

At step 640, the module receives a trigger signal and begins counting a number of cycles. For example, the trigger signal may be received by the module from the trigger event input that is selected, where the trigger signal indicates the occurrence of a trigger event. In one example, the module then counts for a predetermined number of clock cycles in response to receiving the trigger signal. For example, the module may utilize a counter unit for counting from zero to the predetermined number. In one example, the predetermined number is a user-defined operating parameter.

At step 650, the module stops storing new data values from the input data set when the count reaches the predetermined number of cycles. For example, the module may open a switch connecting a source of the input data set (e.g., a multiplexer and/or an external interface) from the shift register. Accordingly, the contents of the shift register effectively remain static following step 650.

At step 660, the module reads out the contents of the shift register via an external interface. For example, the external interface may read out the data values of the input data set that are stored in the shift register following step 650, e.g., using the approach described in connection with FIG. 3, or using a similar mechanism. In one example, the external interface comprises a memory-mapped interface such as DRP, AXI, AXI Lite, or similar interface type. Since multiple clock cycles are required to copy the data values from the shift register to the external interface, in one example the module completes a handshake process with the external interface for safely copying debug/register data across clock domains to the external interface.

Following step 660, the method 600 proceeds to step 695, where the method 600 ends.

Figure 7:
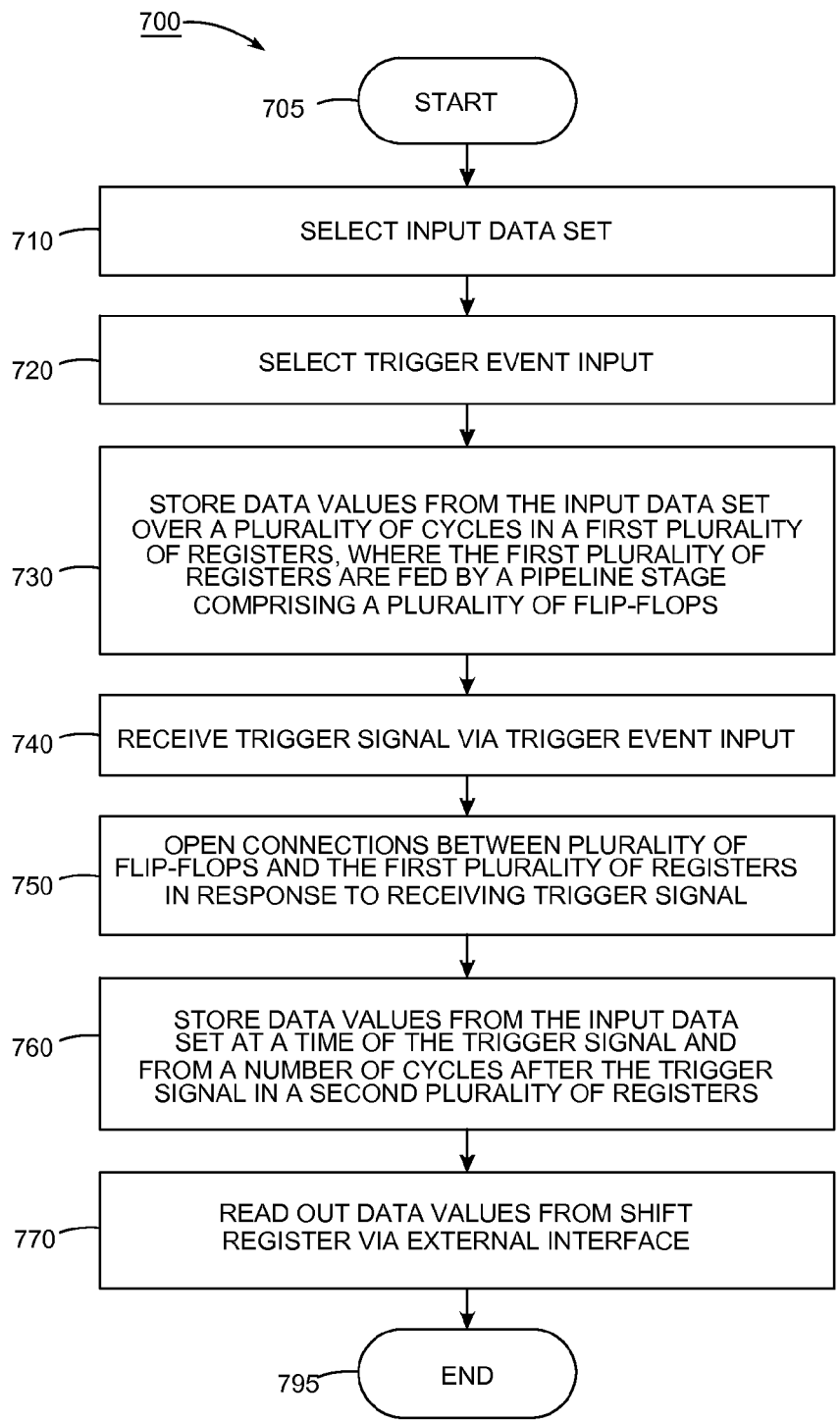
FIG. 7 illustrates a flow diagram of an additional method for capturing internal signal values in a circuit before, during, and after a trigger event, according to one example of the present disclosure.

To further aid in understanding the present disclosure, FIG. 7 illustrates a flow diagram of an additional method 700 for capturing internal signal values in a circuit before, during, and after a trigger event. For example, any one or more of the steps, operations or functions of the method 700 may be implemented by a module or circuit as described above in connection with FIG. 1. One or more aspects of the method 700 may also be implemented by a general purpose computer having one or more processors, a memory, etc. as illustrated in FIG. 8 and described below, specifically programmed to perform the steps, functions and/or operations of the method 700, or to provide input data to configure one or more other devices to implement the operations of the method 700. For illustrative purposes, the method 700 is described below as being performed by a module and/or by a module in conjunction with other elements of a circuit. The method starts in step 705 and proceeds to step 710.

At step 710, the module selects an input data set. For example, step 710 may comprise the same or substantially similar process to that described above in connection with step 610 of the method 600.

At step 720, the module selects a trigger event input. For example, step 720 may comprise the same or substantially similar process to that described above in connection with step 620 of the method 600.

At step 730, the module stores data values from the input data set over a plurality of cycles in a first plurality of registers. For example, for each clock cycle, the module may receive new data values from the input data set. In addition, the module may include a pipeline stage comprising a plurality of flip-flops for holding the new data values that are received. With each cycle, existing data values stored in each flip-flop may be shifted to a next flip-flop in the pipeline. In one example, the pipeline stage may have a width of W-bits, where 'W' is a same number of bits as a maximum width of the plurality of input data sets. In other words, the pipeline stage may comprise 'W' parallel chains of flip-flops. In addition, in one example, the first plurality of registers is fed by the pipeline stage of flip-flops. For instance, an output of each of the plurality of flip-flops may comprise an input to a respective one of the first plurality of registers.

At step 740, the module receives a trigger signal. For example, the trigger signal may be received by the module from the trigger event input that is selected, where the trigger signal indicates the occurrence of a trigger event.

At step 750, the module opens connections between the plurality of flip-flops and the first plurality of registers in response to receiving the trigger signal. For example, the module may open one or more switches to break a connection between the plurality of flip-flops and the first plurality of registers. Accordingly, the data values stored in each of the first plurality of registers is effectively static following step 750.

At step 760, the module stores data values from the input data set at a time of the trigger signal and from a number of cycles after the trigger signal in a second plurality of registers. For example, the module may receive the trigger signal and begin a count for a predetermined number of clock cycles in response to receiving the trigger signal. In one example, the module includes a counter unit for counting from zero to the predetermined number. In one example, the predetermined number is a user-defined operating parameter. In addition, in one example, the predetermined number is obtained from an external memory cell.

Notably, the output of the counter unit may comprise an input to a select line of a demultiplexer, where the data values from the input data set are input into the demultiplexer during each clock cycle and are directed to one of the output lanes of the demultiplexer based upon the value asserted on the select line. Thus, as the counter unit counts from zero up to the predetermined number, the data values from the input data set are directed to different registers of the second plurality of registers. Notably, when the predetermined number of clock cycles is reached, the module stops storing new data values in the second plurality of registers and the data values stored therein are effectively static.

At step 770, the module reads out the contents of the registers via an external interface. For example, the external interface may read out the data values of the input data set that are stored in the first plurality of registers and in the second plurality of registers, e.g., using the approach described in connection with FIG. 3, or using a similar mechanism. In one example, the external interface comprises a memory-mapped interface such as DRP, AXI, AXI Lite, or similar interface type. Since multiple clock cycles are required to copy the data values from the registers to the external interface, in one example the module completes a handshake process with the external interface for safely copying debug/register data across clock domains to the an external interface.

Following step 770, the method 700 proceeds to step 795, where the method 700 ends.

It should be noted that although not specifically specified, one or more steps, functions or operations of the respective methods 600 and 700 may include a storing, displaying and/or outputting step as required for a particular application. In other words, any data, records, fields, and/or intermediate results discussed in the respective methods can be stored, displayed and/or outputted to another device as required for a particular application. Furthermore, steps or blocks in FIG. 6 or FIG. 7 that recite a determining operation or involve a decision do not necessarily require that both branches of the determining operation be practiced. In other words, one of the branches of the determining operation can be deemed as an optional step.

FIG. 8 depicts a high-level block diagram of a general-purpose computer suitable for use in performing and/or supporting some or all of the functions described herein. As depicted in FIG. 8, the system 800 comprises one or more hardware processor elements 802 (e.g., a central processing unit (CPU), a microprocessor, or a multi-core processor), a memory 804, e.g., random access memory (RAM) and/or read only memory (ROM), a module 805 for supporting the capturing of internal signal values in a circuit before, during, and after a trigger event, and various input/output devices 806 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the general-purpose computer may employ a plurality of processor elements.

In one example, computer-readable instructions pertaining to the methods discussed above can be used to configure the hardware processor 802 to perform and/or support the steps, functions, and/or operations of the above disclosed methods. For instance, instructions and data for the present module or process 805 for supporting the capturing of internal signal values in a circuit before, during, and after a trigger event (e.g., a software program comprising computer-executable instructions) can be loaded into memory 804 and executed by hardware processor element 802 to implement and/or support the steps, functions or operations as discussed above in connection with the exemplary methods 600 and/or 700. Furthermore, when hardware processor 802 executes instructions to perform "operations", this could include the hardware processor 802 performing the operations directly and/or facilitating, directing, or cooperating with another hardware device or component (e.g., a co-processor and the like) to perform the operations, such as the modules or circuits described above in connection with FIGS. 1-4. For example, the instructions may cause the hardware processor 802 to provide configuration signals to an exemplary module or circuit of the present disclosure. For instance, the configuration signals may include a selection of a trigger input, a selection of a data input and/or a number of samples to collect. In addition, execution of the computer-readable instructions may cause the hardware processor 802 to configure a memory cell to implement a particular event trigger, to configure a memory cell to store one or more configuration data values, to read-out data values captured in registers of the exemplary modules or circuits of the present disclosure, and so forth.

In addition, in one example the processor executing the computer readable or software instructions relating to the above described methods can be perceived as a programmed processor or a specialized processor. As such, the present module 805 (including associated data structures) can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

The present disclosure may be implemented in whole or in part by a tunable IC, e.g., a PLD and/or FPGA. More specifically, a programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, any one or more components or aspects of the devices and/or algorithms shown and described above in connection with FIGS. 1-4 and 6-7 may be implemented in a plurality of CLBs.

While the foregoing describes various examples in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A circuit, comprising:
   a shift register configured to receive data values of an input data set over a plurality of cycles;
   a counter unit configured to receive a trigger signal and to output the trigger signal after a number of cycles following receipt of the trigger signal, wherein the trigger signal indicates a trigger event; and a switch configured to receive the trigger signal from the counter unit and to open a connection between an input interface and the shift register in response to receiving the trigger signal.

2. The circuit of claim 1, wherein the input interface comprises a first multiplexer configured to select the input data set from a plurality of input data sets.

3. The circuit of claim 2, wherein the first multiplexer includes a select line for receiving a data select input, wherein the data select input is selected by a user.

4. The circuit of claim 2, further comprising:
a second multiplexer configured to select a trigger event input from a plurality of trigger event inputs, wherein the trigger event input that is selected is for providing the trigger signal that indicates the trigger event.

5. The circuit of claim 4, wherein the second multiplexer includes a select line for receiving a trigger select input, wherein the trigger select input is selected by a user.

6. The circuit of claim 1, wherein the number of cycles is selected by a user.

7. The circuit of claim 1, wherein the switch comprises a digital logic switch.

8. The circuit of claim 1 further comprising:
a memory cell, wherein the memory cell stores user-defined values for at least one operating parameter of the circuit.

9. The circuit of claim 8, wherein the at least one operating parameter of the circuit comprises:
the number of cycles;
a selection of the input data set from a plurality of input data sets; or
a selection of a trigger event input from a plurality of trigger event inputs, wherein the trigger event input that is selected is for providing the trigger signal that indicates the trigger event.

10. The circuit of claim 1, wherein the shift register is configured to receive the data values of the input data set from the input interface.

11. A circuit, comprising:
a pipeline stage comprising a plurality of flip-flops for holding data values from an input data set from a number of cycles prior to a trigger signal;
a first plurality of registers for storing the data values from the input data set from the number of cycles prior to the trigger signal, wherein each register of the first plurality of registers receives an output of a respective one of the plurality of flip-flops;
a counter unit configured to receive the trigger signal and to output a count of a number of cycles after the trigger signal;
a demultiplexer with a select line, controlled by an output of the counter unit, for selecting one of a plurality of output lanes; and
a second plurality of registers for storing data values from the input data set at a time of the trigger signal and from the number of cycles after the trigger signal, wherein each of the second plurality of registers is connected to one of the plurality of output lanes of the demultiplexer.

12. The circuit of claim 11, further comprising:
a first multiplexer configured to select the input data set from a plurality of input data sets.

13. The circuit of claim 12, wherein the first multiplexer includes a select line for receiving a data select input, wherein the data select input is selected by a user.

14. The circuit of claim 12, further comprising:
a second multiplexer configured to select a trigger event input from a plurality of trigger event inputs, wherein the trigger event input that is selected is for providing the trigger signal that indicates the trigger event.

15. The circuit of claim 14, wherein the second multiplexer includes a select line for receiving a trigger select input, wherein the trigger select input is selected by a user.

16. The circuit of claim 11, further comprising:
a digital logic switch configured to receive the trigger signal and to open connections between the first plurality of registers and the plurality of flip-flops in response to receiving the trigger signal.

17. The circuit of claim 11, further comprising:
a memory cell, wherein the memory cell stores user-defined values for at least one operating parameter of the circuit.

18. The circuit of claim 17, wherein the at least one operating parameter of the circuit comprises:
the number of cycles after the trigger signal;
a selection of the input data set from a plurality of input data sets; or
a selection of a trigger event input from a plurality of trigger event inputs, wherein the trigger event input that is selected is for providing the trigger signal that indicates the trigger event.

19. A method for capturing internal signal values in a circuit before, during, and after a trigger event, the method comprising:
selecting an input data set;
selecting a trigger event input;
storing data values from the input data set over a plurality of cycles in a shift register; and
stopping the storing of the data values from the input data set over a plurality of cycles in the shift register following a number of cycles after a trigger signal.

20. A method for capturing internal signal values in a circuit before, during, and after a trigger event, the method comprising:
selecting an input data set;
selecting a trigger event input;
storing data values from the input data set over a plurality of cycles in a first plurality of registers, wherein the first plurality of registers are fed by a pipeline stage comprising a plurality of flip-flops;
opening connections between the plurality of flip-flops and the first plurality of registers in response to receiving a trigger signal via the trigger event input; and
storing data values from the input data set at a time of the trigger signal and from a number of cycles after the trigger signal in a second plurality of registers.

* * * * *